(12) United States Patent
Kybett et al.

(10) Patent No.: US 7,120,561 B2
(45) Date of Patent: Oct. 10, 2006

(54) PHASE-ERROR BASED SIGNAL ALIGNMENT

(75) Inventors: Richard Kybett, Camberley (GB); William Jenkins, London (GB)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 10/321,505

(22) Filed: Dec. 18, 2002

(65) Prior Publication Data
US 2004/0122627 A1   Jun. 24, 2004

(51) Int. Cl.
G06F 15/00   (2006.01)
(52) U.S. Cl. ..................................... 702/189
(58) Field of Classification Search ...................... None
See application file for complete search history.

(56) References Cited

U.S. PATENT DOCUMENTS 5,894,496 A    4/1999   Jones
5,926,052 A *  7/1999   Dow et al. .................. 327/234
6,307,411 B1* 10/2001   Kerner ........................ 327/156
2001/0005402 A1 6/2001 Nagatani et al.
2001/0006354 A1 7/2001 Lee

FOREIGN PATENT DOCUMENTS

| EP | 1 111 868 A2 | | 6/2001 |
| JP | 05227237 | * | 9/1993 |
| JP | 09312565 | * | 12/1997 |
| WO | WO 02/33820 A1 | | 4/2002 |

* cited by examiner

Primary Examiner—John Barlow
Assistant Examiner—Jonathan Moffat
(74) Attorney, Agent, or Firm—Banner & Witcoff, Ltd

(57) ABSTRACT

The present invention relates to a method and circuit arrangement for performing signal alignment, wherein signals to be aligned are controlled based on a frequency response of a phase error determined in the comparison. Thereby, the input and output signals can be aligned even in the presence of considerable distortion, as they are now compared using a quantity immune to the effects of both amplitude-based and phase-based distortions.

19 Claims, 5 Drawing Sheets

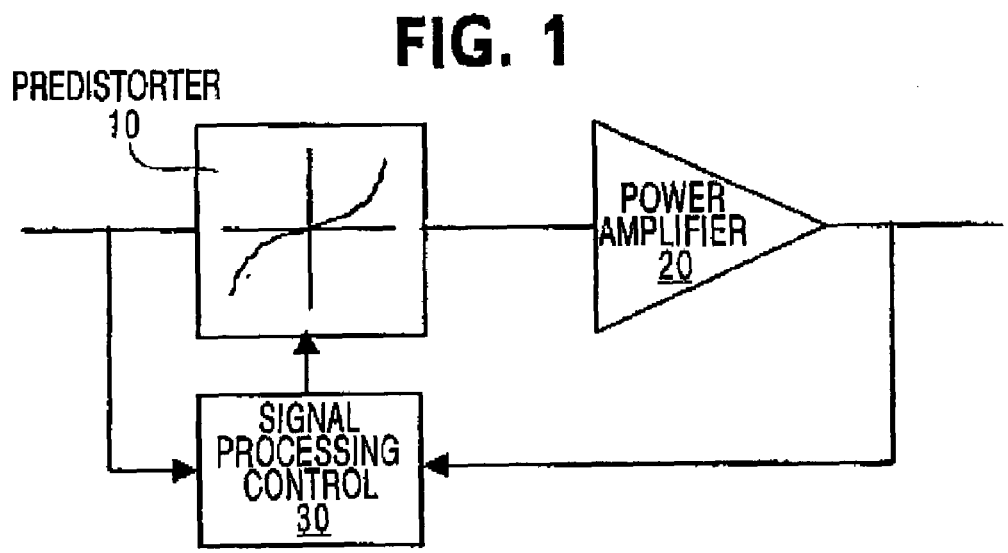
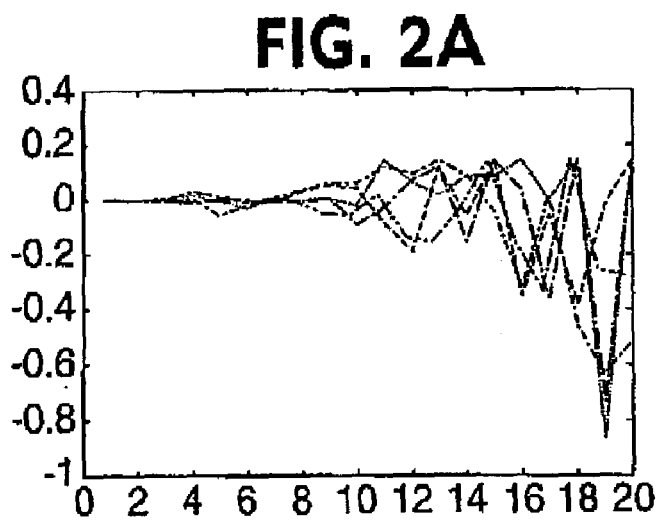
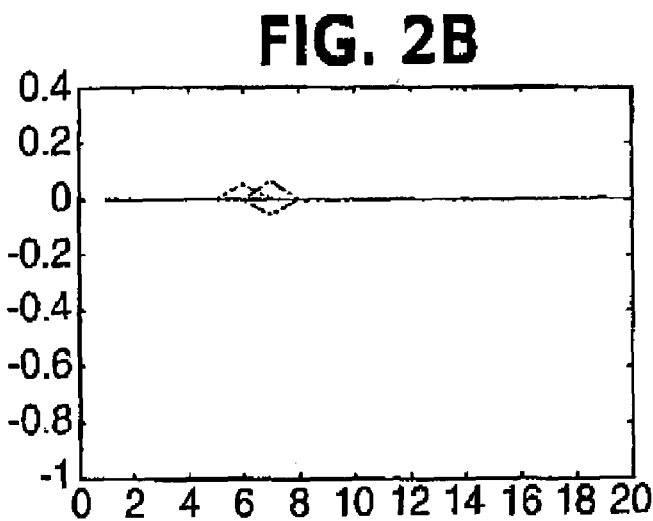

PHASE-ERROR BASED SIGNAL ALIGNMENT

BACKGROUND OF THE INVENTION

1. Field of the Invention

The present invention relates to a method and circuit arrangement for aligning signals, which may be used in any signal processing system.

2. Description of the Invention

Accurate signal alignment functions for aligning two signals are required in many kinds of applications. As one example, digital pre-distortion based linearization circuits require accurate signal alignment, for the following reasons.

The development of digital linearization circuits capable of responding to both fast and slow variations in power amplifier non-linear characteristics is an important step toward cost-effective bandwidth-efficient communications. Two kinds of distortion are to be considered, i.e. amplitude and phase distortions. Real amplifiers have a maximum output power, i.e. saturation level, and an input-output power relationship which will depart from a linear relationship as the output power approaches the saturation level. This is referred to as AM/AM distortion. Similarly, a phase shift depending on the power level will also occur, referred to as AM/PM distortion. The final effect of AM/AM and AM/PM distortion is the generation of unwanted spectral energy both in-band (within the transmission channel) and out-of-band (outside the transmission channel). The in-band energy will cause distortion of the transmitted signal and the out-of-band energy will cause adjacent channel interference (ACI).

In order to improve the efficiency and reduce the size and cost of broadcast transmitters, the linearity of the power amplifier or other concerned circuit arrangements must be increased. This can be achieved by using pre-distortion techniques. A pre-distorter is a device which generates a distortion that compensates for the power amplifier distortion. The result of pre-distortion is that the power amplifier can operate at higher power with the same level of distortion or at the same power with lower distortion. Theoretically, signal pre-distortion can be realized at radio frequency (RF), at intermediate frequency (IF) or at base-band.

In its simplest analog implementation, a practical pre-distorter can be a network of resistors and non-linear elements such as diodes or transistors. However, due to the fact that amplifier characteristics are not constant, but vary with time, frequency, power level, supply voltage and environmental conditions, only moderate performance can be achieved by simple analog pre-distortion techniques. Better results have been achieved by adaptive pre-distortion schemes where the compensating non-linearity is implemented in digital signal processing (DSP) hardware. This approach provides the advantages that the pre-distorter is completely digital, resulting in a very stable product that does not require alignment or tuning in production and that is totally insensitive to environmental variations, and is capable of being augmented with adaptive circuitry that does not require training or periodic sequences to become a fully automatic corrector.

FIG. 1 shows a schematic block diagram of an adaptive pre-distortion scheme. A digital adaptive pre-distorter 10 is located at the input terminal of a power amplifier 20, wherein the output signal of the power amplifier 20 is fed back to a signal processing control unit 30 which also receives the input signal supplied to the pre-distorter 10. It is noted that the signals supplied to, output and processed by the pre-distorter 10 and the digital signal processing unit 30 are digital signals, while the signal amplified by the power amplifier 20 is an analog signal. Therefore, respective digital-to-analog and analog-to-digital circuits have to be provided, which are not shown in the schematic diagram of FIG. 1.

In order for a digital adaptive pre-distortion (DAPD) system to work effectively, two things are required. First, accurate time-alignment of the amplifier input and output signals in the digital domain has to be achieved, and, second, an accurate amplifier model which can correct for all necessary distortions to the required level must be established. It is the time-alignment of the input and output signals that is the subject of this invention.

By its very nature, however, this requires the alignment of two similar, but not identical signals. The transmitted signal is distorted as it is amplified, so the signal fed back to the alignment algorithm at the signal processing unit 30 after amplification is no longer the same as the original signal output by the pre-distorter 10, due to AM/AM and AM/PM distortion. The degree of this difference will be dependent on the DAPD architecture and the convergence state of the system.

SUMMARY OF THE INVENTION

The present invention provides a signal alignment scheme, by means of which proper time alignment of the input and output signals can be achieved.

The method of performing signal alignment of the invention, comprises the steps of:

comparing a first signal supplied to a signal processing circuit with a second signal obtained from an output of the signal processing circuit, in order to obtain a phase difference between the first and second signals; and controlling alignment of the first and second signals based on a frequency response of the phase difference obtained from the comparison step.

Furthermore, a circuit arrangement in accordance with the invention for performing signal alignment, comprises:

comparing means for comparing a first signal supplied to a signal processing circuit with a second signal obtained from an output of the signal processing circuit; and control means for controlling alignment of the first and second signals based on a frequency response of a phase difference obtained from the comparing means.

Accordingly, if there is a linear phase slope across the band of interest, i.e. if there is a constant time delay against frequency, the phase error across the band are also constant. This certainty allows the signals to be aligned, even in the presence of considerable distortion, as signals are now compared using a quantity which is immune to the effects of both AM/AM or AM/PM distortion.

Specifically, the method of the invention may comprise the steps of setting predetermined positive and negative thresholds for frequency deviations of the first and second signals, calculating a first sum by adding those values of the phase errors which have been obtained at a frequency deviation beyond the predetermined positive threshold, calculating a second sum by adding those values of the phase error which have been obtained at frequency deviations beyond the negative threshold, and controlling the pre-distortion so as to obtain a balance between the first and second sums. This balance may be obtained when the first and second sums are substantially equal. Furthermore, the predetermined first and second thresholds may be selected such that sufficient phase-error values are obtained to remove random effects such as noise by averaging, and without including the points at low frequency offsets that have been distorted by the amplifier.

The alignment method may be used in a digital adaptive pre-distortion system.

The control means of the alignment circuit arrangement may control pre-distortion means to revise stored pre-distortion factors in accordance with the output of the comparing means. The signal processing circuit may be an amplifier circuit or any other signal processing circuit for which an alignment is desired.

BRIEF DESCRIPTION OF THE DRAWINGS

In the following, the present invention is described in greater detail based on a preferred embodiment with reference to the accompanying drawings, in which:

FIG. 1 shows a schematic block diagram of an adaptive pre-distortion scheme in which the present invention can be applied;

FIGS. 2A and 2B show respective diagrams indicating an alignment error against input signal amplitude comparing amplitude-phased and phase-based alignment functions;

DESCRIPTION OF THE PREFERRED EMBODIMENT

Figure 3:
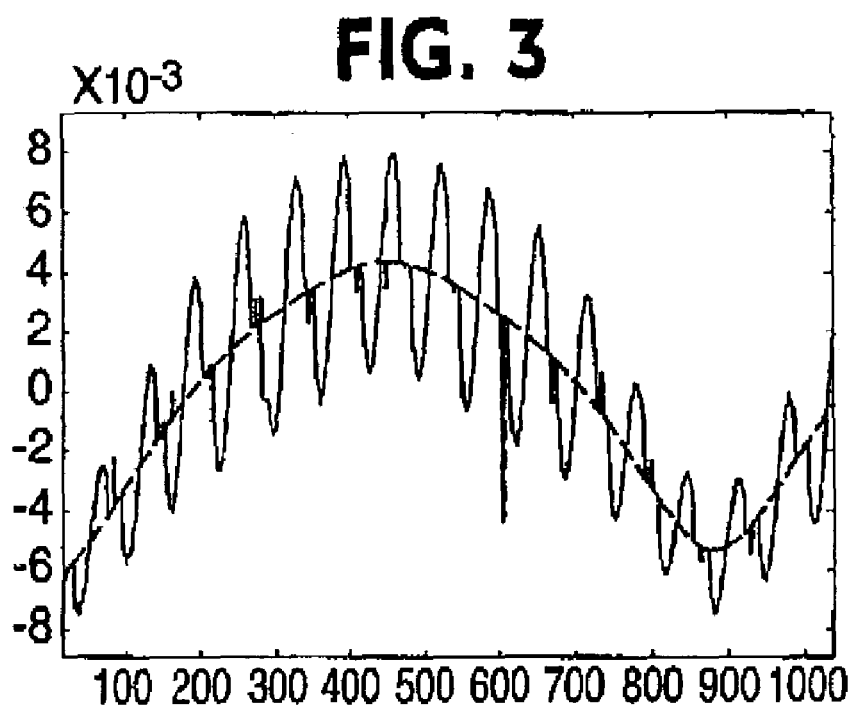
FIG. 3 shows a diagram indicating an instantaneous frequency against sample number for a specific waveform of an undistorted and distorted amplifier output signal.

The preferred embodiment is now be described on the basis of an alignment scheme used in a linearization function of an amplifier circuit which may be used for amplifying an EDGE (Enhanced Data Rates for Global Evolution) signal of a mobile communication system.

In particular, simulations were carried out to allow control of unknown quantities and for the alignment performance to be accurately assessed. To achieve this, a two-carrier EDGE waveform with separation of 1.2 MHz was generated. The waveform was passed through an amplifier model consisting of measured AM/AM and AM/PM data. Then, a known fractional delay, e.g. $\pi/3$, was introduced to the amplified and distorted signal. The original and distorted/delayed waveforms were then passed to amplitude-based and phase-based alignment functions in units of fraction of a sample and the results were compared against the known fractional delay. These steps were repeated over various values of input signal level to investigate how the quality of the alignment varied as the amount of distortion increased from below the noise floor to approximately—35 dBc.

FIGS. 2A and 2B show the results of these tests, with the horizontal axis giving input signal level and the vertical axis showing the error in the delay given by the alignment functions. A new set of waveform data was generated for each test point and the data sent to the two alignment functions was identical in each test. Five sets of amplitude sweeps were performed, shown as different traces in the diagrams of FIGS. 2A and 2B.

The diagram in FIG. 2A shows obtained alignment error against input signal amplitude using an amplitude-based alignment function, while the diagram on the right-hand side indicates alignment error against input signal amplitude using the phase-based alignment function which is the subject of the invention. The diagrams clearly show that the amplitude-based alignment function gives much larger alignment errors than the phase-based function, and that the problem gets worse as the distortion increases with larger amplitude values.

It is not immediately clear why this should be the case. As both the amplitude and phase of the input signal are distorted by the amplifier, either should be valid as an indicator for use in an alignment function. However, there is one significant difference. Magnitude is a scalar quantity that, without phase information, can only have values greater than or equal to zero. Magnitude distortion in amplifiers is, in general, compressive, but even if not, for example at certain amplitudes with class AB amplifiers, the magnitude error at a certain input amplitude is approximately constant, ignoring drift over time and temperature and memory effects, and always of the same sign. This causes problems if waveforms are aligned purely on the basis of magnitude, as the magnitude information in the distorted waveform has been altered in a non-linear way, giving rise to an alignment inaccuracy which increases with the degree of distortion, as clearly illustrated by the diagram of FIG. 2A.

In comparison, phase distortion can have both positive and negative signs. To explain this further, it is useful to consider the time derivative of phase, which is defined as the 'instantaneous frequency' of the modulating waveform (frequency is always defined as the rate of change of phase, but as this is not constant for a modulated signal, it can only be calculated on a sample-by-sample or "instantaneous" basis). If the instantaneous frequency of the complex baseband waveform is plotted against time, it varies between both positive and negative values, corresponding to positive and negative frequency offsets away from the center of the frequency band.

FIG. 3 shows a diagram indicating a small portion of a plot of instantaneous frequency ($d\phi/dt$) against sample number for a two-carrier EDGE wave-form, both before and after amplification using a non-linear amplifier model consisting of measured AM/AM and PM/PM data.

The scale on the vertical axis shows the time-derivative of the phase, with sample number plotted along the horizontal axis. Referring to FIG. 3, it can be seen that the distorted signal shows that the instantaneous frequency of the signal is modulated by the amplitude of the input signal, as the amplitude affects the phase (AM-PM distortion) and this, in turn, alters the derivative of the phase. The interesting feature to note is that the error in instantaneous frequency due to the changes in amplitude varies approximately equally around the ideal undistorted value (bold dotted line). Over a large number of sample plots, when correctly aligned, the sum of these positive and negative phase errors will tend towards zero, and therefore their combined effect can be removed. Since amplitude errors do not have this equally-distributed characteristic around zero and over a large number of sample points, the cumulative effect of the magnitude errors becomes large and upsets the alignment. The reason for this is that the input signal is affected by the amplifier in a non-linear fashion, i.e. amplitude peaks are compressed, changing both the peak-to-average ratio of the signal and its statistics. Now, before alignment can take place, both signals are normalized to the same peak level, and this has the same effect as increasing the average power level of the compressed signal. Therefore, an undesirable offset is generated between the average power levels of the two signals.

Unfortunately, it is impossible to know the amount of offset without first accurately aligning the signals, and as it is impossible to accurately align the signals without knowing this offset there appears to be no way around the problem. In effect, the offset introduces an error into the alignment which cannot be compensated. When the two signals are then aligned on the basis of amplitude, the most 'similar' alignment is not the same as the correct alignment, and as the distortion increases, the difference between these two answers increases.

Figure 4:
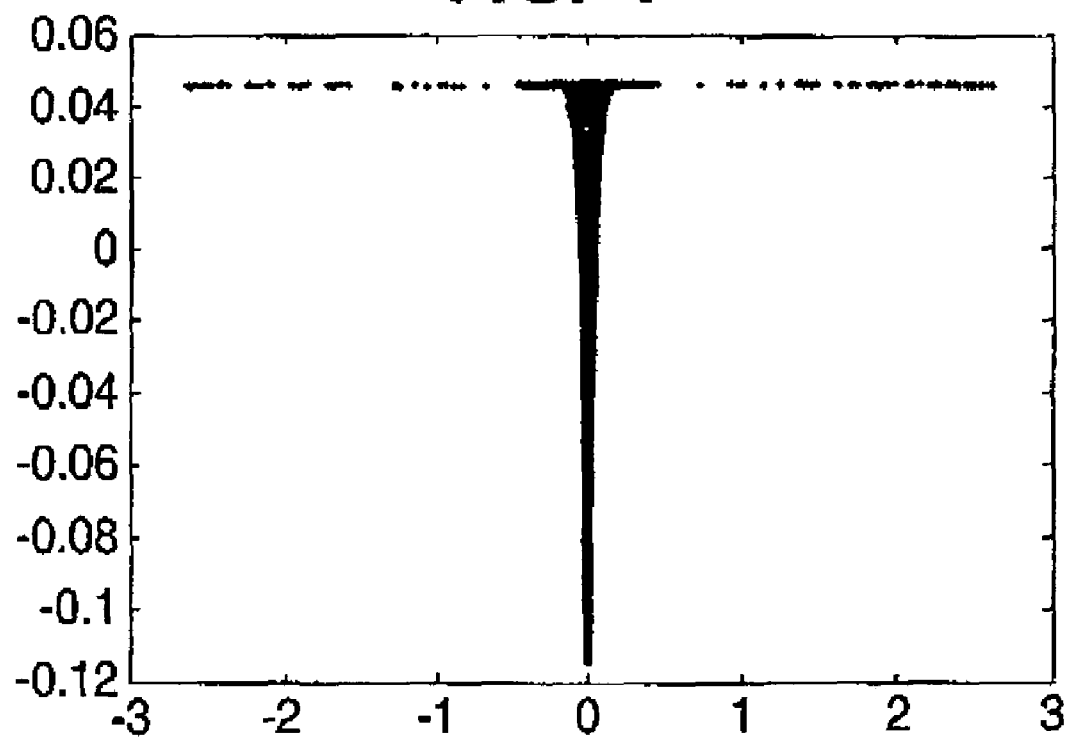
FIG. 4 shows a phase error vs. instantaneous frequency diagram after correct alignment.

FIG. 4 shows a phase-error vs. instantaneous frequency diagram which has been obtained by taking the transmitted and received signals after correct alignment as inputs for producing a corresponding phase-error vs. instantaneous frequency diagram. An interesting feature of this diagram is that the phase-error vs. instantaneous frequency shows a T-shaped characteristic with a flat horizontal top at correct alignment.

Figure 5:
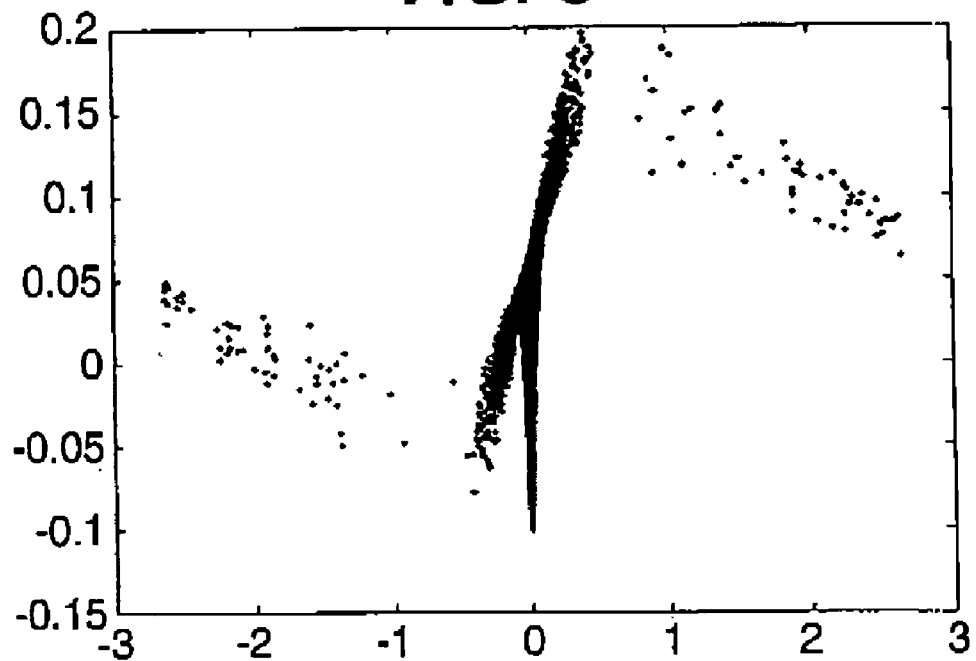
FIG. 5 shows a phase error vs. instantaneous frequency diagram after incorrect alignment.

FIG. 5 shows a corresponding diagram obtained for incorrect alignment of the input and output signals of the measured amplifier circuit. The obtained diagram of phase-error vs. instantaneous frequency for incorrect alignment shows a T-shaped characteristic with a sloping top. Thus, the sloping top gives a clear indication that the alignment is incorrect, as the phase error now appears to be frequency-offset dependent. However, since it is known that no frequency-dependent models are being used in these simulations, this can only be due to inaccurate alignment. Consequently, a control circuit for achieving alignment should perform control so as to keep the top of the T-shaped characteristic flat, i.e. the phase error against instantaneous frequency should be kept constant within this region. This certainty allows the signal to be aligned, even in the presence of considerable distortion. In general, it is possible to use all phase errors in the calculation, but as there tend to be a great many more towards the center, i.e. near 0 Hz offset, the sensitivity of the optimum finding would be reduced. By selecting those points towards the edges of the top of the T-shape, the influence of these errors is increased and the alignment function can find the correct alignment more easily.

Figure 6:
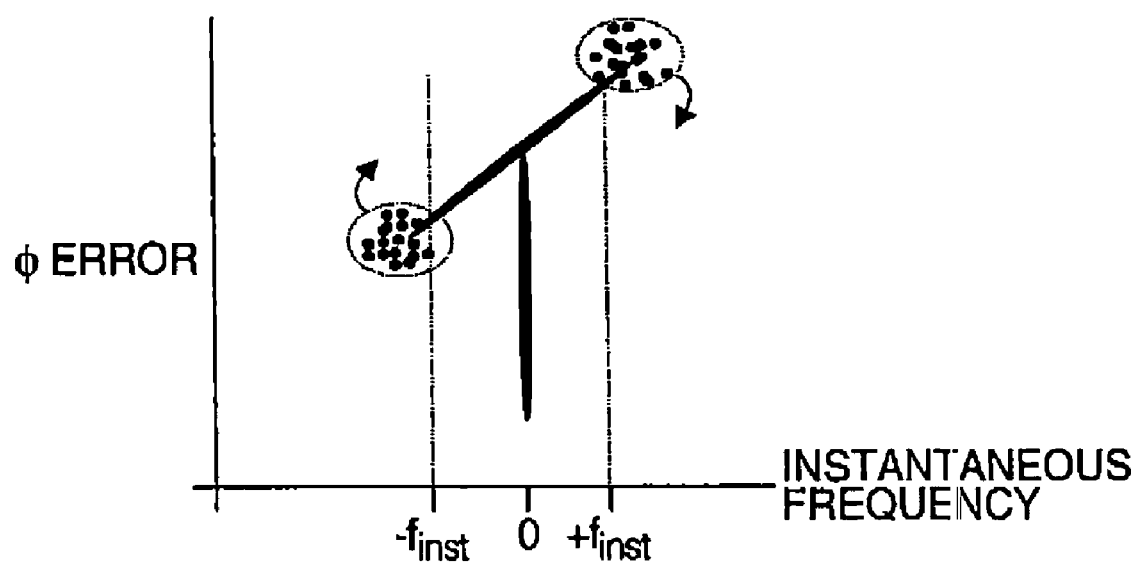
FIG. 6 shows an illustration indicating the use of phase errors to align waveforms.

FIG. 6 shows a schematic diagram which is based on the measurement diagram indicated in FIG. 5 and which indicates how to use phase errors to align waveforms. In particular a positive threshold $+f_{inst}$ of the instantaneous frequency deviation and a negative threshold $-f_{inst}$ of the instantaneous frequency deviation are indicated on the horizontal axis, beyond which phase error values indicated within the dotted circle should be shifted by the alignment control function to be located at the same error level, as indicated by the arrows in FIG. 6. This can be achieved by summing the phase errors beyond the positive and negative thresholds and adjusting the time delay between the two signals to force the sum of each group of phase errors to be equal. However, there should be roughly equal numbers of positive and negative errors, so that a relatively large number of points should be obtained. A suitable value for the positive and negative thresholds of the instantaneous frequency beyond which the phase errors are summed can be determined in advance based on an observation of the measurement results, as indicated in FIG. 5. This may be performed manually or automatically by a corresponding software routine.

Thus, the phase errors can be balanced around zero to remove the influence of the AM/PM distortion shown in FIG. 5.

Figure 7:
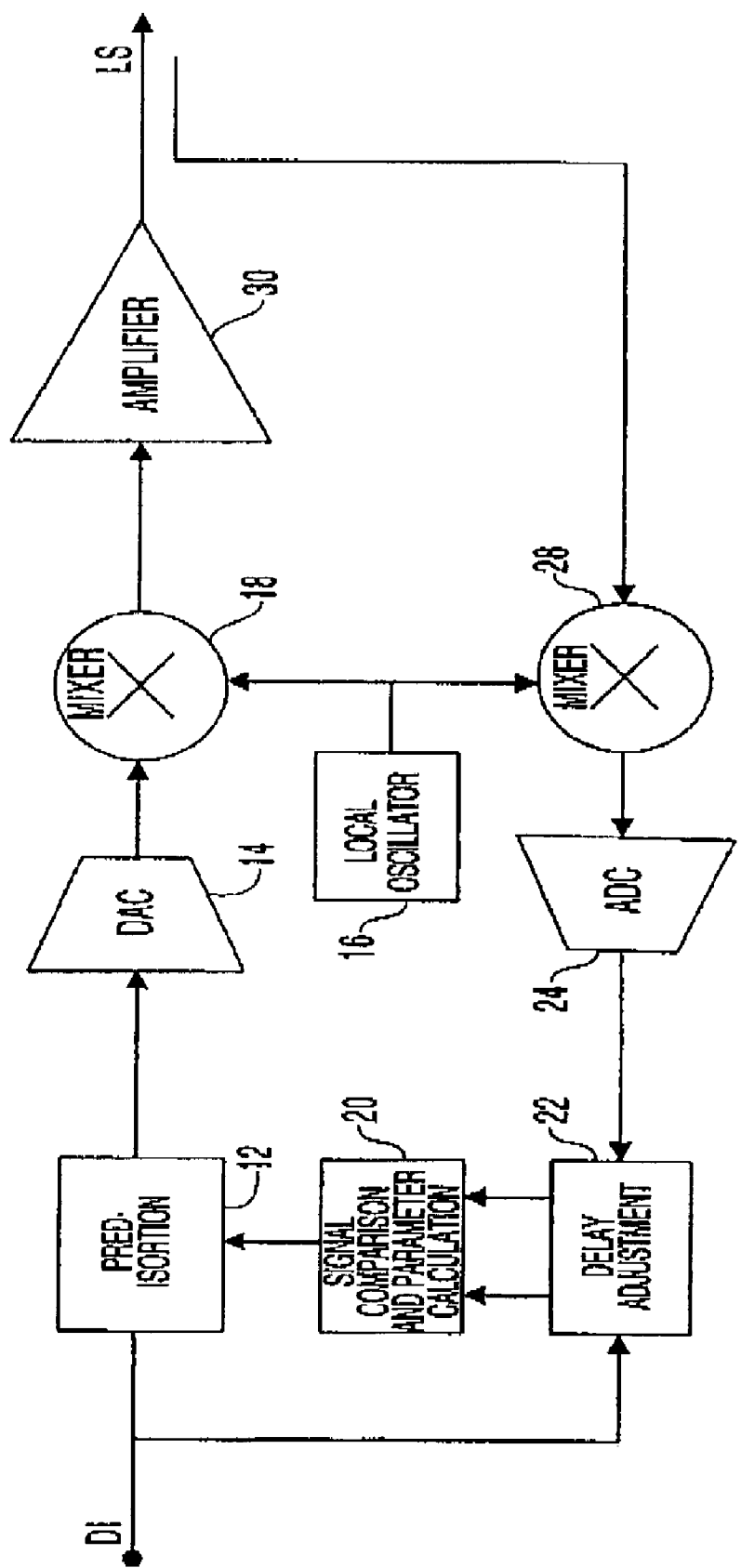
FIG. 7 shows a schematic block diagram of a linearization circuit arrangement with an alignment function according to the preferred embodiment.

FIG. 7 shows a schematic block diagram of a predistortion system with an alignment processing circuitry according to the preferred embodiment. According to FIG. 7, the linearization circuit arrangement comprises an input terminal for inputting baseband data DI, e.g. of an EDGE signal, to a predisortion block 12 and to a delay adjustment block 22. The predistortion block 12 applies a predistortion to the input data DI before being converted into an analog signal by a digital-to-analog converter (DAC) 14, after which it is upconverted, i.e. by a first mixer 18 to which an oscillator signal generated by a local oscillator (LO) 16 is supplied, and passed to an amplifier 30 which is to be linearized by applying the predistortion. A sample of the output signal LS is down-converted, i.e. by a second mixer 28 to which the oscillator signal generated by the LO 16 is also supplied, and then translated back into the digital domain by an analog-to-digital converter (ADC) 24. Thus, the LO 16 is used for both up- and down-conversion.

According to the present invention, the delay adjustment block 22 is provided so as to time-align the received or fed-back and transmitted signals, as there will be a delay incurred when the signal passes around the loop. It is this delay that must be accurately compensated before the signals can be compared in a signal comparison and parameter calculation block 20 in order to calculate the parameters that will be used in the predistortion block 12.

Figure 8:
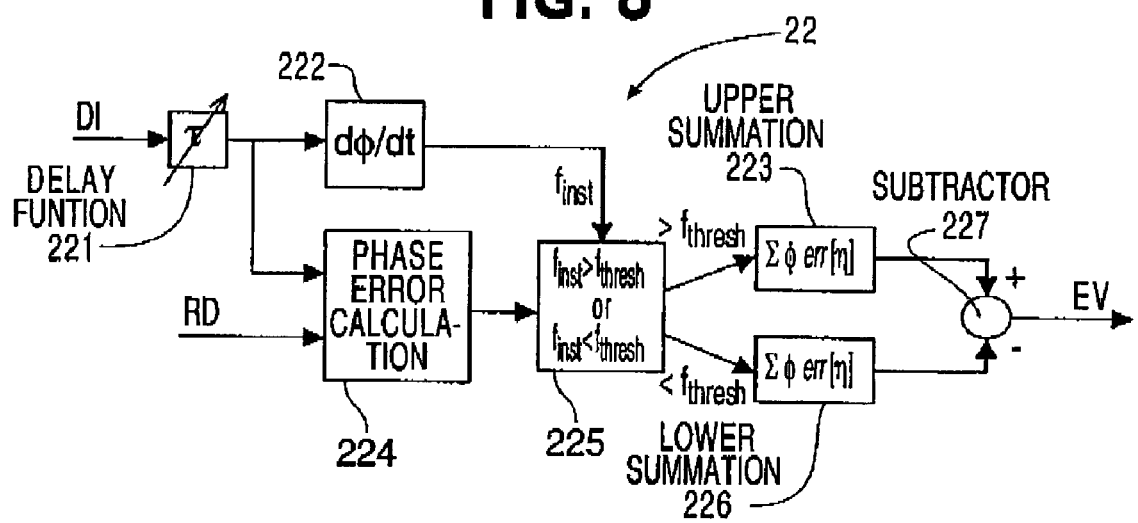
FIG. 8 shows a schematic block diagram of an alignment method according to the preferred embodiment.

FIG. 8 shows a schematic block diagram indicating further details of the processing functions of the delay adjustment block 22. It should be noted that the transmitted and received or fed back signals can be interchanged— that is, either may be delayed with respect to the other, and that this is only an example of a possible implementation.

In FIG. 8, the transmitted signal, i.e. the input data DI, is shown as being time-delayed with respect to the received data RD obtained at the output of the ADC 24 of FIG. 7. The amount of delay is adjusted by a delay function 221 so as to minimize an error value EV at the output. The phase error is calculated on a sample-by-sample basis in a phase-error calculation block 224, as is the instantaneous frequency of the transmitted data in a $d\phi/dt$ block 222. The phase-error values are then sorted according to their corresponding instantaneous frequency values $f_{inst}$, with those errors occurring at instantaneous frequencies greater than some positive threshold $f_{thresh}$ value being summed in an upper summing branch 223 and those having an instantaneous frequency lower than some negative threshold $f_{thresh}$ being summed in a lower summing branch 226. After a suitable number of samples, the obtained two sums of the phase-error values are subtracted by a subtraction function 227 to give the error value EV that is then used to tune the delay. The time delay of the delay function 221 is then adjusted, and then another set of samples can be processed as described above to generate phase-errors that are separated and summed to obtain a new error value EV. This process continues until the error value has been minimized.

The preset positive and negative threshold values for the instantaneous frequency deviation may be manually programmed or may be automatically determined. As already mentioned, the positive and negative threshold values may be determined to correspond to the edges of the sloping top of the T-characteristic indicated in FIGS. 5 and 6.

Figure 9:
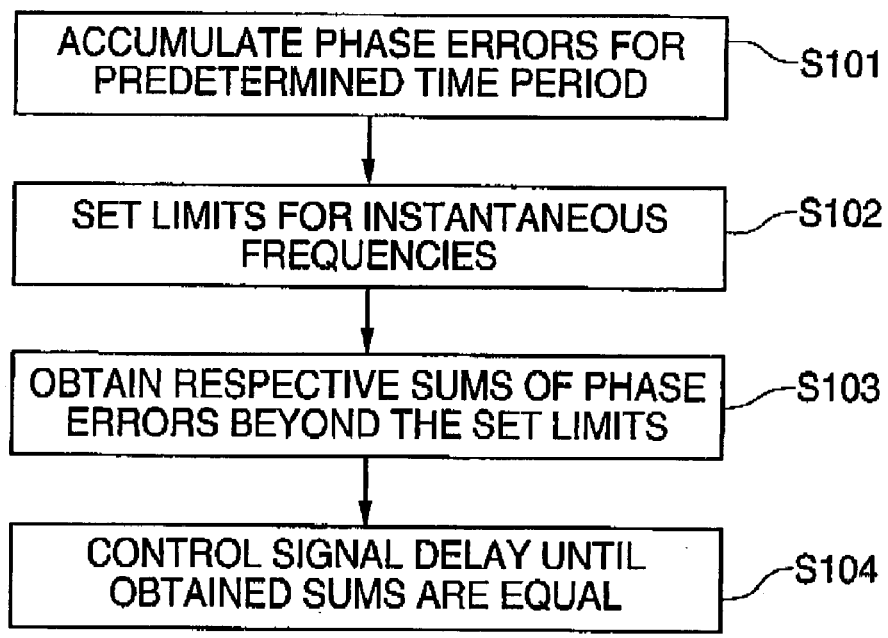
FIG. 9 shows a schematic flow diagram of an alignment processing according to the preferred embodiment.

FIG. 9 shows a schematic flow diagram of the alignment processing for obtaining a time alignment of the two signals supplied to the signal comparison and parameter calculation block 20 in the circuit arrangement of FIG. 7. In S101, phase errors are accumulated in the upper and lower summing branches 223, 226 for a predetermined time period. The time period is selected so as to ensure a roughly equal number of positive and negative phase error sample values. Then, limits, i.e. positive and negative thresholds, for the instantaneous frequencies are set based on an automatic determination or a manual setting or programming (step S102). Based on the positive and negative threshold values, respective sums of phase errors at instantaneous frequencies beyond the limits are obtained (step S103). Finally, signal alignment is achieved by controlling the delay function 221 until the obtained sums are balanced or substantially equal, e.g. until error value EV is minimized (step S104). Thereby, a reliable alignment of the input and output signals can be obtained even in cases where the signals are highly distorted.

It is noted that the present invention is not restricted to the preferred embodiment described above but can be used in any signal processing function for any kind of signal, where an alignment of signals is desired. Moreover, any kind of balancing function for balancing the frequency response of the phase errors can be implemented. The essential principle of the present invention thus resides in the use of a frequency response of the phase error for controlling alignment of input and output signals. The preferred embodiment may thus vary within the scope of the attached claims.

The invention claimed is:

1. A method of performing signal alignment, the method comprising the steps of:
   a) comparing a first signal supplied to a signal processing circuit with a second signal obtained from an output of said signal processing circuit;
   b) controlling alignment of the first and second signals based on a frequency response of a phase error having instantaneous frequency values determined in the comparison step; and
   c) wherein the controlling step comprises the steps of setting predetermined positive and negative thresholds for frequency deviations of one of the first and second signals, calculating a first sum by adding those values of the phase errors, which have been obtained at a frequency deviation beyond the predetermined positive threshold, calculating a second sum by adding those values of the phase error, which have been obtained at frequency deviations beyond the negative threshold, and delaying at least one of the first and second signals so as to obtain a balance between the first and second sums.

2. A method according to claim 1, wherein the controlling step flattens the frequency response.

3. A method according to claim 1, wherein the balance is obtained when the first and second sums are substantially equal.

4. A method according to claim 3, wherein the predetermined first and second thresholds are selected to substantially correspond to respective edges of a sloping top of a T-shaped characteristic of the frequency response of the phase error.

5. A method according to claim 4, wherein the alignment method is used in a digital pre-distortion system.

6. A method according to claim 3, further comprising the step of obtaining the frequency deviation by comparing instantaneous frequencies of one of the first and second signals with the positive and negative thresholds.

7. A method according to claim 6, wherein the predetermined first and second thresholds are selected to substantially correspond to respective edges of a sloping top of a T-shaped characteristic of the frequency response of the phase error.

8. A method according to claim 7, wherein the alignment method is used in a digital pre-distortion system.

9. A method according to claim 6, wherein the alignment method is used in a digital pre-distortion system.

10. A method according to claim 3, wherein the alignment method is used in a digital pre-distortion system.

11. A method according to claim 1, wherein the predetermined first and second thresholds are selected to substantially correspond to respective edges of a sloping top of a T-shaped characteristic of the frequency response of the phase error.

12. A method according to claim 11, wherein the alignment method is used in a digital pre-distortion system.

13. A method according to claim 1, further comprising the step of obtaining the frequency deviation by comparing instantaneous frequencies of one of the first and second signals with the positive and negative thresholds.

14. A method according to claim 13, wherein the alignment method is used in a digital pre-distortion system.

15. A method according to claim 13, wherein the predetermined first and second thresholds are selected to substantially correspond to respective edges of a sloping top of a T-shaped characteristic of the frequency response of the phase error.

16. A method according to claim 15, wherein the alignment method is used in a digital pre-distortion system.

17. A method according to claim 1, wherein the alignment method is used in a digital pre-distortion system.

18. A circuit arrangement for performing signal alignment, comprising:
   a) comparing means for comparing a first signal supplied to a signal processing circuit with a second signal obtained from an output of the signal processing circuit;
   b) control means for continuing alignment of the first and second signals based on a frequency response of a phase error having instantaneous frequency values determined by the comparing means;
   c) wherein the control means controls a delay means to apply a delay to one of the first and second signals in accordance with the output of the comparing means; and
   d) further comprising summing means for adding phase errors supplied from the comparing means, so as to calculate a first sum of those values of the phase errors which have been obtained at a frequency deviation beyond a predetermined positive threshold and a second sum of those values of the phase errors which have been obtained at a frequency deviation beyond a predetermined negative threshold, wherein the control means is arranged to control the delay means to obtain a balance between the first and second sums.

19. A circuit arrangement according to claim 18, wherein the signal processing circuit is an amplifier circuit for amplifying and EDGE signal.

* * * * *